United States Patent [19]
Kline, Jr.

[11] 4,045,796
[45] Aug. 30, 1977

[54] CORRELATION SYSTEM FOR PSEUDO-RANDOM NOISE SIGNALS

[75] Inventor: Arthur Jonathan Kline, Jr., Scottsdale, Ariz.

[73] Assignee: Motorola Inc., Schaumburg, Ill.

[21] Appl. No.: 741,443

[22] Filed: Nov. 12, 1976

Related U.S. Application Data

[63] Continuation of Ser. No. 524,847, Nov. 18, 1974.

[51] Int. Cl.² .................................................. G01S 9/56
[52] U.S. Cl. ................................... 343/6.5 R; 325/42; 343/6.5 LC; 343/12 R
[58] Field of Search ............ 343/6.5 R, 6.5 LC, 12 R; 325/42

[56] References Cited

U.S. PATENT DOCUMENTS

| | | | |
|---|---|---|---|
| 2,982,853 | 5/1961 | Price et al. | 325/65 |
| 3,350,644 | 10/1967 | McNair | 325/42 |
| 3,706,933 | 12/1972 | Bidell et al. | 325/479 |
| 3,750,168 | 7/1973 | Schrader et al. | 343/6.5 R |

Primary Examiner—S.C. Buczinski
Attorney, Agent, or Firm—M. David Shapiro

[57] ABSTRACT

An improved correlation system for coded signals wherein a signal is known in pattern but is unknown in timing and is bi-phase modulated on a suppressed carrier signal and correlation is accomplished with a time reference signal without the necessity for search and coherent recovery of the suppressed carrier signal.

18 Claims, 6 Drawing Figures

CORRELATION SYSTEM FOR PSEUDO-RANDOM NOISE SIGNALS

This is a continuation of application Ser. No. 524,847, filed Nov. 18, 1974.

FIELD OF THE INVENTION

The present invention relates to a demodulation system, and, in particular, to an improved correlation system wherein the modulated signal is demodulated without requiring search and coherent recovery of the suppressed carrier signal, thereby allowing faster and more efficient operation of the system.

BACKGROUND OF THE INVENTION

Suppressed carrier transmission systems have been used for a variety of reasons, the most prevalent being for the purpose of concentrating of a maximum energy level in the modulating or information carrying part of the transmission signal. This technique has been frequently combined with spread spectrum modulating techniques which have had the further advantages of reducing peak power levels and providing desirable noise rejection characteristics. The digital pattern of pseudo-random noise signals have demonstrated very desirable correlation characteristics and, because of long pattern repetition times, ambiguity problems in long distance ranging systems have been overcome. A common embodiment of these systems utilizes digital pseudo-random noise signals, bi-phase modulated and a suppressed carrier.

A disadvantage of these systems was apparent because the suppressed carrier construction of the modulated transmission signal prevented the use of the carrier as a directly available reference signal for purposes of recovery of the modulation/ information signal. Therefore, simultaneous search and recovery methods have been developed to make the carrier available as a reference signal for use in demodulating and recovering of the intelligence from the modulating signal. The prior art systems, therefore, impose a simultaneous two-step requirement for recovery of information; first, search and recovery of the suppressed carrier signal and; second, search and recovery of the modulating signal. The total recovery time is a product function of each of the two steps of the two step process. A reduction in time for recovery is desirable for improvement of system efficiency. Sequential recovery rather than simultaneous recovery would reduce the time required to the sum of the two steps rather than a product thereof and would accomplish the desired significant time reduction. A system capable of modulation recovery without the necessity of suppressed carrier recovery would allow the desired sequential recovery and represent a significant time efficiency.

SUMMARY OF THE INVENTION

The foregoing and other shortcomings and problems of the prior art spread spectrum systems are overcome, in accordance with the present invention, by eliminating the necessity for simultaneous recovery of the suppressed carrier signal and of the modulating signal, thereby allowing sequential recovery and a significant reduction in total recovery time.

According to one aspect of the present invention, a demodulator is utilized which does not require recovery of the suppressed carrier signal to accomplish correlation of the digital pseudo-random noise reference signal with the bi-phase modulated pseudo-random noise reference signal with the bi-phase modulated pseudo-random noise signal on the suppressed carrier.

According to another aspect of the present invention, circuit complexity of the demodulation system is reduced below that of prior art systems.

According to yet another aspect of the present invention, the lessor complexity of the demodulation system provides for lower cost in the apparatus required for signal correlation.

The foregoing and other aspects of the invention will be understood more fully from the following detailed description of an illustrative embodiment of the present invention in conjunction with accompanying drawings, in which.

DETAILED DESCRIPTION OF THE PREFERRED EMBODIMENT

Figure 1:
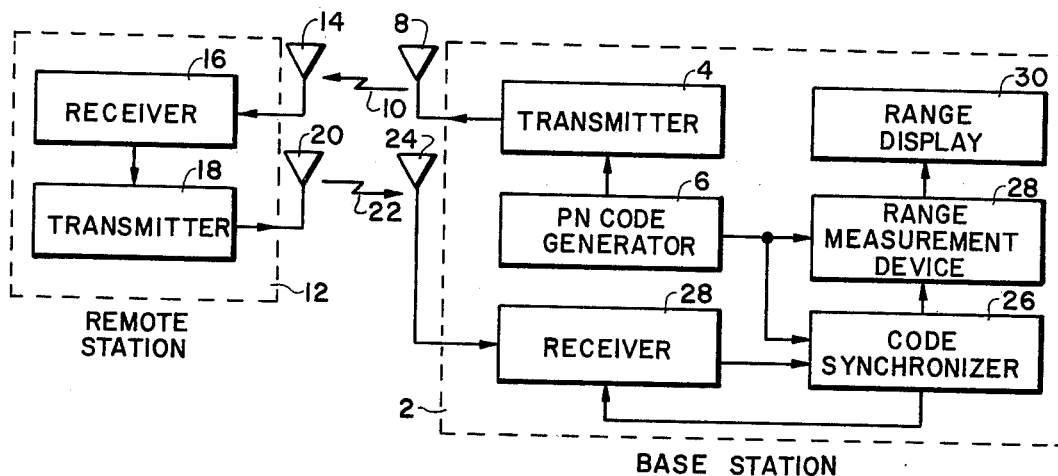
FIG. 1 shows a block diagram of a prior art spread spectrum ranging system of the general type subject to the improvement of the present invention.

A block diagram of a typical prior art spread spectrum range measurement system is shown in FIG. 1. This system is typically used for measurement of the range between base station 2 and remote station 12 by measuring the delay time over path lengths 10, 22 and converting this delay to the corresponding range. In this ranging system base station 2 transmitter 4 is modulated by digital pseudo-random noise hereinafter alternatly referred to as PN code generator 6. A suppressed carrier, bi-phase signal is generated in transmitter 4 and the signal is emitted via antenna 8 and path 10 to remote station 12 receiving antenna 14. The signal is demodulated by receiver 16 and is then used to modulate transmitter 18 which transmits a signal by way of antenna 20 and path 22 to receiving antenna 24 of base station 2. This signal is identical to the bi-phase suppressed carrier signal transmitted from transmitting antenna 8 to receiving antenna 14 over path 10 except that it is delayed in time as a direct function of the total length of paths 10 and 22. The code sychronizer 26 is used to control a local oscillator of receiver 28 to effect a search of the range of frequencies around the suppressed carrier frequency. The code synchronizer 26 is then used to search all possible time positions of the PW code (delayed) as derived from receiver 28. After synchronism has been achieved with the received suppressed carrier and the received PN Code (delayed), the code synchronizer 26 applies the delayed PN Code to range measurement device 28 where it is compared to the undelayed PN Code from PN Code generator 6. Range measurement device 28 measures the delay and applies a proportional signal to range display 30 whereby the range may be observed by an operator. All of the apparatus and techniques of this system are well known in prior art.

Figure 3:
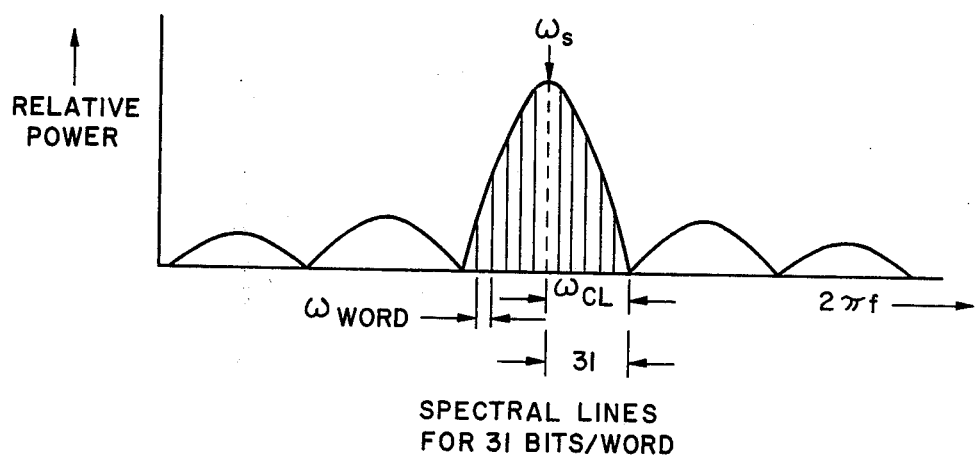
FIG. 3 shows the frequency spectrum of a bi-phase modulated suppressed carrier signal of the type used in the system of FIG. 1
Figure 2:
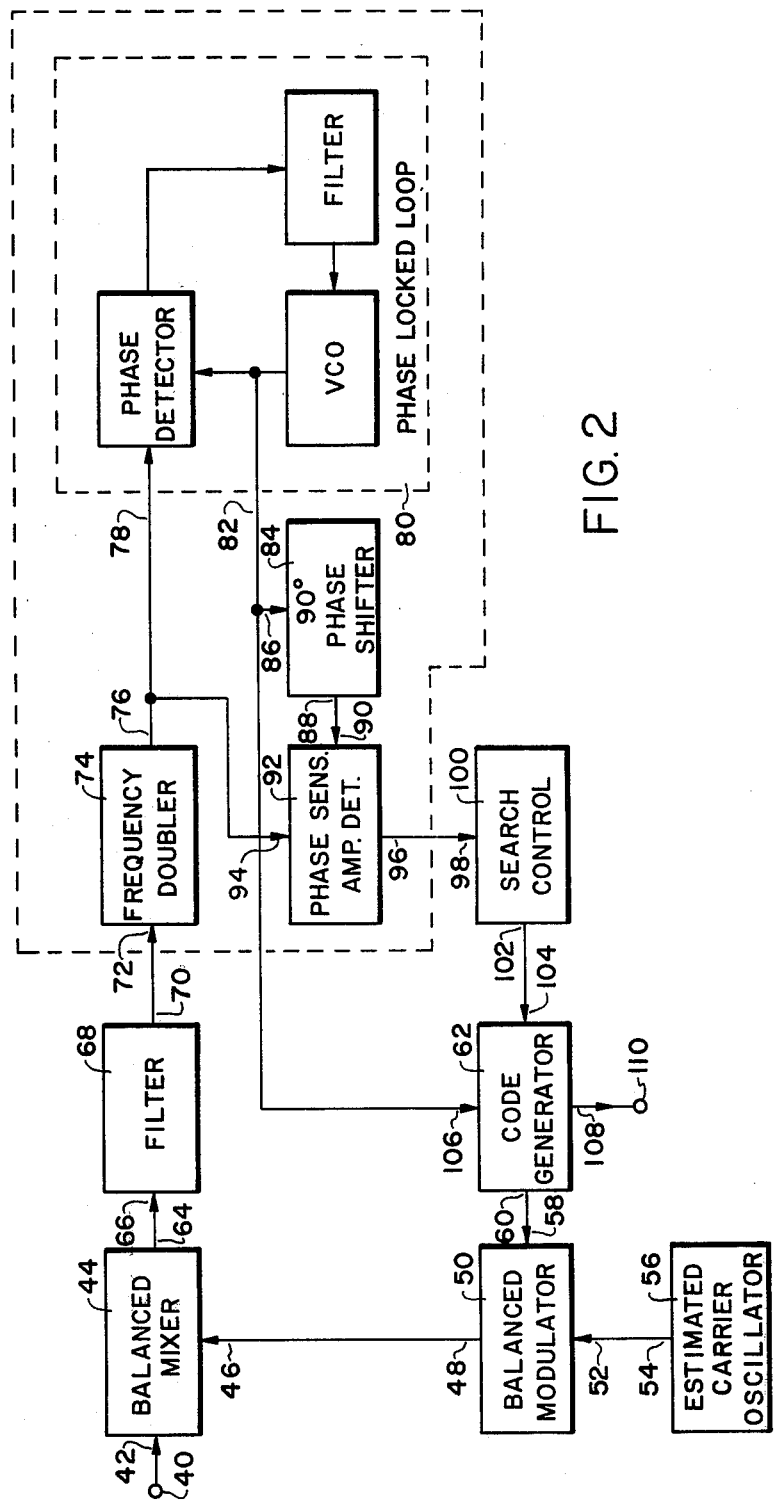
FIG. 2 is a detailed block diagram of one embodiment of the present invention as it would be used in the Base Station Receiver of the system of FIG. 1.

The present invention is concerned with the elimination of the requirement for suppressed carrier frequency search, thereby reducing the time required for acquisition of the PN Code modulation in the base station code synchronizer. FIG. 2 shows the code synchronizer of a preferred embodiment of the present invention. The improved system accomplishes correlation of the PN Code without the necessity of recovering the suppressed carrier signal thereby saving the time formerly required for suppressed carrier frequency search and lockup. More specifically, the suppressed carrier PN Code modulated signal is present at input 40 and is applied to balanced mixer 44 at input terminal 42. The frequency spectrum of this signal is shown in FIG. 3. This spectrum may be characterized by the expression:

$$M(t) \, S(t)$$

where M(t) is the PN Code modulation and S(t) is the suppressed carrier signal. In the spectrum of FIG. 3, $\omega_{word}$ defines the spacing between spectral lines due to the repetitive length of the PN Code modulation.

The word length utilized in this typical embodiment is made up of 31 bits; of course, any other suitable word length may be utilized without changing the scope of the invention. $\omega_{cl}$ in FIG. 3 defines the spectral width of each data bit of the 31 bit sequence. $\omega_s$ represents the position of the suppressed carrier signal. The second input, at terminal 46 of balanced mixer 44, as shown in FIG. 2, is applied from output terminal 48 of balanced modulator 50.

The signal from balanced modulator 50 is derived from a first input at terminal 52 from output terminal 54 of estimated carrier oscillator 56 and second input 58 from output terminal 60 of code generator 62. The estimated carrier oscillator 56 frequency is expressed as: $\omega_s + \omega_e$, where $\omega_s$ is the received carrier frequency and $\omega_e$ is the error frequency which can carry either sign. $\omega_e$ is purposely made to be large for reasons discussed below. The output from terminal 60 of code generator 62 is different from the PN Code used to modulate the system transmitter (not shown) in that every other bit value is inverted or complemented, as is described in greater detail in a further discussion of the details of code generator 62. The effect of this inversion of every other bit is to include an $\omega_{cl}/2$ term in this code that is not present in the PN Code. For convenience and clarity, this code may alternately be designated as the PN*code. The product of the $\omega_s + \omega_e$ estimated carrier signal present at first input terminal 52 of balanced modulator 50 and the PN*code present at second input terminal 58 of balanced modulator 50 yield an output at output terminal 48 which contains a $\omega_{cl}/2$ component, a $\omega_s + \omega_e$ component and a PN code component.

Figure 4:
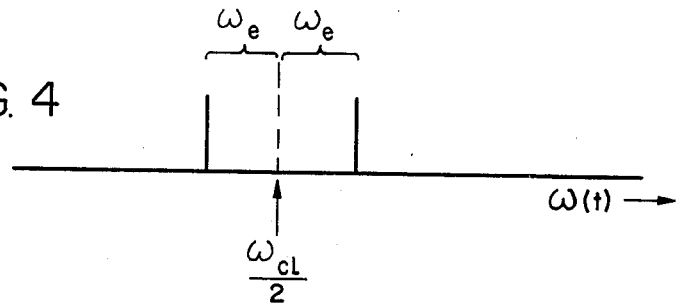
FIG. 4 shows the spectral characteristics of the signal output of the filter 68 of FIG. 2.
Figure 5:
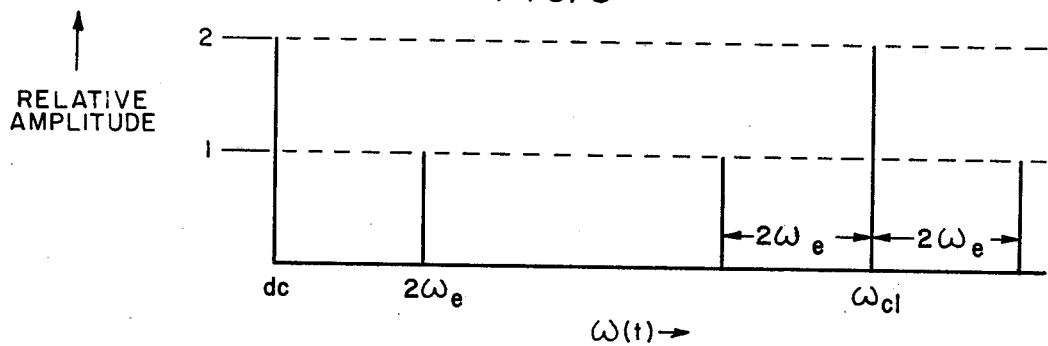
FIG. 5 shows the spectral characteristics of the output of the Frequency Doubler of FIG. 2.

When this composite signal is applied at second input terminal 46 of balanced mixer 44, the spectrum of FIG. 4 is produced at output terminal 64. This spectrum is the result of the difference components of the two input signals to balanced mixer 44 and although there are other frequency components present, they are rejected by the circuits which follow as will be explained. The two $2\omega_e(t)$ terms represent the zero and $\pi$ components of the bi-phase estimated carrier error. The average of the two $2\omega_e(t)$ components is represented by the suppressed component M(t)/2. Referring again to FIG. 2, the output from terminal 64 of balanced modulator 44 is connected to input terminal 66 of filter 68. Filter 68 rejects the undesirable spectral components of output 64 of balanced mixer 44. The resulting output 70 from filter 68 is connected to input terminal 72 of frequency doubler 74. The effect of frequency doubler 74 is to square the input signals at terminal 72; the spectrum at output terminal 76 of frequency doubler 74 is as shown in FIG. 5. The predominate output in terms of amplitude is the $\omega_{cl}$ or system clock frequency. Further, the only evidence of carrier frequency components are the ¼ amplitude components of $\omega_e$, the error is estimated carrier generated by estimated carrier oscillator 56.

The output signal from terminal 76 of frequency doubler 74 is connected to input terminal 78 of phase locked loop 80. In practice, the carrier frequency error would purposely be made large enough so that the phase locked loop 80, which acts as a narrow band filter, will easily reject the undesired $\omega_e$ components.

The output of phase locked loop 80 at output terminal 82 is a sine wave of frequency $\omega_{cl}$. Output terminal 82 is connected to 90° phase shifter 84 input terminal 86. The 90° phase shifter provides a clock phase reference sine wave at output terminal 88. This signal is connected to first input terminal 90 of phase sensitive amplitude detector 92. Second input terminal 94 of phase sensitive amplitude detector 92 is connected to output terminal 76 of frequency doubler 74. The response time of phase lock loop 80 is slow compared to bi-phase modulation rate of output 76 from frequency doubler 74.

Phase sensitive amplitude detector 92 compares the average phase of the two signal inputs and produces a D.C. control signal at outut terminal 96 which is at one of two binary levels depending on this phase comparison. This signal is connected to input terminal 98 to search and control 100. Search and control 100 produces one extra bit in the clock driver line of code generator 62 to compensate for a lagging code generator 100 with respect to the received code. This adding or inhibiting of one clock bit is done repetitively at a slow enough rate to allow the relatively slow reacting phase locked loop 80 to regain a locked condition on the resulting signal at input terminal 78. When enough bits are added or inhibited to make the code generator 62 synchronize to within one bit time of the incoming code signal, phase locked loop 80 further improves the synchronization of the received and local codes by shifting the phase of the clock signal at output terminal 82 until code generator 62 is in phase bit-for-bit with the received code signal at input terminal 40, at which time the output 96 of the phase sensitive amplitude detector 92 will change terminating the search.

Figure 6:
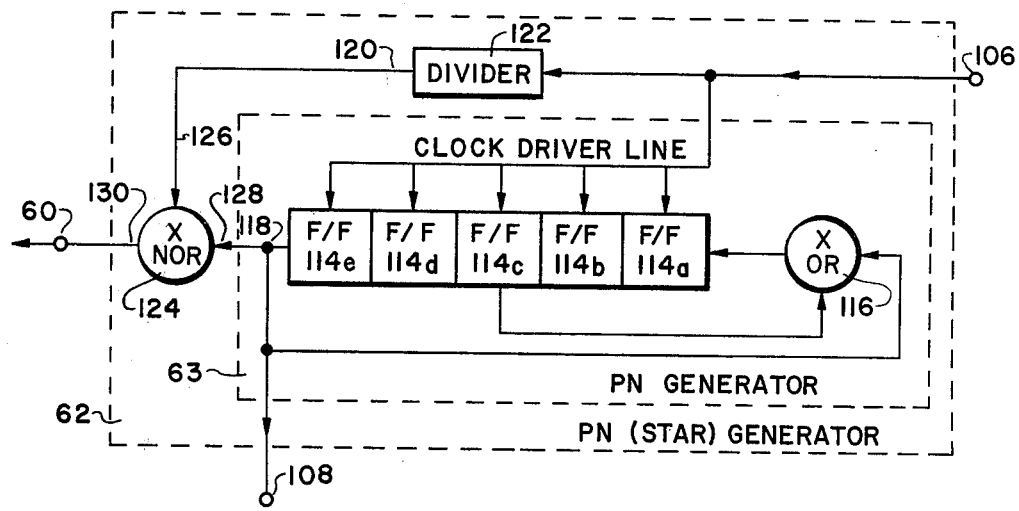
FIG. 6 is a more detailed drawing of the code generator of FIG. 2.

Code generator 62 is shown in more detail in FIG. 6. Within the code generator 62 is PN generator 63 comprising five flip-flops; 114a, 114b, 114c, 114d, and 114e, arranged as a five stage shift register with clock drive from input terminal 106 and "exclusive or" circuit 116 fed from flip-flops 114c and 114e. This arrangement is well known in prior art. Formation of PN code at output terminal 60 is accomplished by adding the PN code at PN generator output terminal 118 modulo two with the clock signal divided by two from output terminal 120 of divider 122. Divider 122 divides by two the frequency of the signal at input terminal 106, clock input. Clock signal divided by two from divider 122 output terminal 120 is connected to exclusive nor 124 input terminal 126. PN generator 63 output terminal 118 is connected to exclusive nor 124 input terminal 128. Exclusive nor 124 adds the two input signals modulo two to provide PN*code at output terminal 130 which is connected to code generator 62 output terminal 60.

Output terminal 118 of PN generator 63 is also connected to code generator 62 output terminal 108. This provides synchronized PN code output for use such as in range measurement device 28 of FIG. 1. Thus it may be seen that this embodiment of the invention accomplishes demodulation and correlation of a pseudo-random noise signal bi-phase modulated on a suppressed carrier wave signal without the necessity for coherent recovery of the suppressed carrier signal, thereby significantly reducing the time and circuitry necessary to the accomplishment of this purpose.

It will be obvious to one skilled in the art that once the demodulated signal is recovered, it may be modulated with the correlated PN code signal to derive the carrier and any spectral component thereof not contained in the correlated PN code. Therefore, information carried by the suppressed carrier signal such as doppler, digital data or the like may be recovered very simply and directly once the deomodulating system of the invention has produced the correlated PN code.

The system, as described may be used, for example, in ranging systems, in systems wherein it is desirable to use spread spectrum transmission for concealment of the transmission, or in systems where a garbeled form of transmission for digital information is desirable, or in other systems requiring the characteristics of spread spectrum bi-phase modulated suppressed carrier operation.

The embodiments of the invention as described herein are by example only and are not intended to limit embodiments of the invention to those specifically described. Numerous other modifications an alternative arrangements may be devised by those skilled in the art without departing from the spirit and scope of the invention.

What is claimed is:

1. A system for correlation of a first coded digital signal having a clock frequency with an identical coded digital signal of unknown time delay which is bi-phase modulated on a suppressed carrier signal, without recovery of the suppressed carrier signal, comprising:
  means for inverting alternate bits of the first coded digital signal for providing a PN* signal having a frequency component at one-half the clock frequency of the first coded signal;
  means for generating an estimated carrier signal;
  means for modulating said estimated carrier signal with said PN* signal;
  means for mixing said modulated signal with the identical coded signal of unknown time delay;
  means for squaring said mixed signal for providing a coded signal having a clock frequency equal to the clock frequency of the first coded signal; and
  means for controlling the phase of the first coded signal with said squared signal for correlating the first coded signal with the identical coded signal of unknown time delay.

2. The system according to claim 1 comprising:
  means for deriving said unknown time delay; and
  means for displaying said derived time delay.

3. The system according to claim 1 comprising:
  means for deriving said unknown time delay;
  means for translating said time delay to a spatial distance form; and
  means for displaying said spatial distance form for readout.

4. The system according to claim 1 wherein said estimated carrier signal has an error component with respect to the suppressed carrier signal.

5. The system according to claim 4 wherein said means for squaring comprises:
  meand for filtering undesired frequency components of said mixed signal.

6. A system for correlation of a first coded digital signal having a clock frequency with an identical coded digital signal of unknown time delay which is bi-phase modulated on a suppressed carrier signal, without recovery of the suppressed carrier signal, comprising:
  means for converting the first coded digital signal for providing a modified coded digital signal having a frequency component at one-half the clock frequency of the first coded digital signal;
  means for combining said modified coded digital signal with said coded digital signal of unknown time delay;
  means for squaring said combined modified coded digital signal and coded signal of unknown time delay for providing a combined signal having a frequency component at the clock frequency; and
  means for controlling the phase delay of the first coded digital signal with said squared signal for correlating the first coded digital signal with the coded digital signal of unknown time delay.

7. The system according to claim 6 wherein said means for squaring comprises a frequency doubler.

8. The system according to claim 6 wherein said means for squaring comprises:
  means for filtering said combined signal for eliminating undesired frequency components, said filtering means having an output signal; and
  means for frequency doubling said output signal of said filtering means.

9. The system according to claim 8 wherein said means for controlling comprises a phase locked loop for extracting a clock frequency signal from said squared signal.

10. The system according to claim 9, wherein said means for controlling comprises:
  phase sensitive circuit means for phase shifting said clock frequency signal to provide phase synchronization of said first coded digital signal and said bi-phase modulated signal.

11. The system according to claim 6 wherein said means for combining comprises:
  oscillating means for generating an estimated carrier signal, said estimated carrier signal having an error frequency;
  means for modulating said estimated carrier signal with said converted signal for producing a product signal thereof; and
  means for mixing said bi-phase modulated signal with said product signal for generating a combined signal.

12. The system according to claim 11 wherein said squaring means comprises:
  filtering means for rejecting undesired frequency components from said mixed signal; and
  means for frequency doubling the output of said filtering means.

13. The system according to claim 12, wherein said controlling means comprises:
  phase lock loop means for extracting a clock frequency signal from said mixed signal;

means for digitally changing the clock signal frequency for controlling digital phase delay of the first coded digital signal; and means for phase shifting the first coded digital signal in response to a phase difference of less than one count between said clock frequency and said coded digital signal of unknown time delay.

14. A method for correlating a first coded digital signal having a clock frequency with an identical coded digital signal of unknown time delay which is bi-phase modulated on a suppressed carrier signal, without the necessity for recovery of the suppressed carrier signal, comprising the steps of:

converting the first coded digital signal to a modified coded digital signal haivng a frequency component at one-half the clock frequency of the first coded digital signal;

combining said modified coded digital signal with the coded digital signal of unknown time delay;

squaring said combined signal to provide a combined signal having a frequency component at the clock frequency; and controlling the phase delay of the first coded digital signal with said squared signal for correlating the first coded digital signal with the coded digital signal of unknown time delay.

15. The method according to claim 14 wherein said squaring step is accomplished with a frequency doubler.

16. The method according to claim 14 wherein said squaring step further comprises:

filtering said combined signal to eliminate undesired frequency components; and doubling the frequency of said filtered signal to produce a signal at the clock frequency.

17. The method according to claim 16 wherein said controlling step further comprises:

recovering the clock frequency by means of a phase locked loop.

18. The method according to claim 17 wherein said controlling step further comprises:

shifting the phase of the first coded digital signal to correlate with the time delay of the digital signal of unknown time delay in response to a shift in the phase of said recovered clock frequency signal.

* * * * *